United States Patent
Tomasini et al.

[11] Patent Number: 5,770,954
[45] Date of Patent: Jun. 23, 1998

[54] CURRENT COMPARATOR WITH INTRINSIC LIMITATION OF ABSORPTION TO THE LOWEST CURRENT LEVEL

[75] Inventors: Alfredo Tomasini, Acquiterme; Gianluca Colli, Sannazzaro de' Burgondi; Ernestina Chioffi, Pavia, all of Italy

[73] Assignee: SGS-Thomson Microelectronics, S.r.l., Agrate Brianza, Italy

[21] Appl. No.: 728,396

[22] Filed: Oct. 9, 1996

[30] Foreign Application Priority Data

Oct. 19, 1995 [EP] European Pat. Off. .............. 95830420

[51] Int. Cl.⁶ .................................................. H03K 5/22
[52] U.S. Cl. .................. 327/63; 327/65; 327/77
[58] Field of Search ............................... 327/65, 66, 77, 327/103, 63; 323/315

[56] References Cited

U.S. PATENT DOCUMENTS

| | | | |
|---|---|---|---|
| 4,069,460 | 1/1978 | Sauer | 327/104 |
| 4,554,468 | 11/1985 | Rumbaugh et al. | 327/66 |
| 5,136,184 | 8/1992 | Deevy | 307/362 |
| 5,142,696 | 8/1992 | Kosiec et al. | 323/315 |
| 5,349,286 | 9/1994 | Marshall et al. | 323/315 |
| 5,446,397 | 8/1995 | Yotsuanagi | 327/66 |
| 5,512,849 | 4/1996 | Wong | 327/77 |

FOREIGN PATENT DOCUMENTS

| | | | |
|---|---|---|---|
| 0 349 954 | 1/1990 | European Pat. Off. | H03K 5/24 |
| 30 35 471 | 4/1981 | Germany | H03F 1/32 |
| 2058504 | 4/1981 | United Kingdom | H03F 3/45 |

*Primary Examiner*—Toan Tran
*Attorney, Agent, or Firm*—Allen, Dyer, Doppelt, Milbrath & Gilchrist, P.A.

[57] ABSTRACT

A method and a respective circuit arrangement capable of markedly limiting the absorption of current by a current comparator circuit. The invention consists in limiting the absorption of current through the branch of the comparator circuit, along which is forced the highest current to the value of the lowest current, which is in turn forced through the other branch of the comparator circuit. This condition is obtained without interfering in any way with other characteristics of switching speed and sensitivity of the comparator circuit.

25 Claims, 6 Drawing Sheets

CURRENT COMPARATOR WITH INTRINSIC LIMITATION OF ABSORPTION TO THE LOWEST CURRENT LEVEL

CROSS-REFERENCE TO RELATED APPLICATION

This application claims priority from 95830420.6, filed Oct. 9, 1995, which is hereby incorporated by reference. However, the content of the present application is not necessarily identical to that of the priority application.

BACKGROUND AND SUMMARY OF THE INVENTION

The present invention relates to integrated circuits of signal processing and in particular to current comparators.

Current comparator circuits are ubiquitous components of many analog systems including data converters and similar front-end signal processing applications. The smallest devices, high speed and low consumption, constitute the basic requisites of any new project of this type.

The following articles, all of which are hereby incorporated by reference, describe various CMOS current comparator circuits:

"Novel approach to high speed CMOS current comparators", by H. Träff, Electronics Letters, Jan. 30, 1992, Vol. 28, No. 3;

"Fast CMOS multilevel current comparator", by H. Gustat, Electronics Letters, Apr. 1, 1993, Vol. 29, No. 7; and "High performance CMOS current comparator", by A. T. K. Tang and C. Toumazou, Electronics Letters, Jan. 6, 1994, Vol. 30, No. 1.

The comparison between two currents is made by forcing the currents to be compared through the two branches of a differential (unbalanced) stage circuit so as to be able to discriminate the highest (or lowest) input current by monitoring the respective voltage levels of two nodes of each branch of the unbalanced circuit. Usually, while one of the nodes swings to voltage close to the supply voltage, the other node drops down to a potential close to the common ground potential of the circuit. A dedicated buffer stage or several stages in cascade provide a logic signal that is representative of the result of the comparison between the two input currents, forced through the respective branches of the comparator circuit.

Forcing the currents to be compared through the respective branches of the comparator circuit implies an absorption of these currents from a supply rail and therefore an attendant consumption which will be higher or lower, depending on the level of the input currents to be compared.

In many instances, the absorption and therefore the consumption depend substantially on the level of the highest current being compared, which may indeed be a preestablished reference current with which to compare a certain current signal.

The present application advantageously discloses a method and a respective circuit arrangement capable of markedly limiting the absorption of current by a current comparator circuit. The invention consists in limiting the absorption of current through the branch of the comparator circuit, along which is forced the highest current to the value of the lowest current, which is in turn forced through the other branch of the comparator circuit. This condition is obtained without interfering in any way with other characteristics of switching speed and sensitivity of the comparator circuit.

This twofold function of the circuit: that is of comparing and at the same time limiting the current absorption, is implemented with an extremely simple circuit that requires an exceptionally reduced number of components, basically only three transistors, thus offering advantages also in terms of the overall economy of integration.

Fundamentally, the invention consists of discriminating the level of two currents while limiting the current in the branch of the unbalanced circuit through which is being forced the highest of the two currents to the value of the other (lowest) current which flows in the other branch of the unbalanced circuit. In practice, the circuit of the invention is able to accomplish the required comparison by operating at a current level that is limited to the value of the lowest current, without requiring the use of any switch or other digitally controlled device.

The output or sensing node of the branch through which is forced the "lowest" current assumes a relatively "low" potential, whereas the other output or sensing node, that is the "output" node of the branch through which is forced the "highest" current assumes a relatively "high" potential. In other words, the logic configuration provided by the comparator circuit is coherent with the relative level of the compared currents.

An important aspect of the circuit of this invention is the fact that it is composed of a particularly reduced number of components, if compared to the number of components required for realizing known current comparator circuits with similar performances.

The circuit of the invention can be designed in CMOS technology in various ways e.g; by employing exclusively p-channel devices, or by employing cascoded n-channel or p-channel devices, or in a complementary form employing devices of both types of conductivity.

Essentially, the circuit of the invention uses a source-follower stage that can, for example, be constituted of a single MOS transistor, whose state or electrical behavior is determined by the logic configuration assumed by the two complementary output nodes of the respective branches of the current comparator circuit. Such a stage or device is capable of assuming an operating state that effectively limits the current in the branch of the circuit through which the highest current is being forced to a value equivalent to the value of the lowest current that is being forced through the other branch of the comparator circuit.

In the case of a stage realized with a single MOS transistor, the disclosed means advantageously exploit the capacity of such device by assuming different operating states (in a so-called linear zone or in a saturation zone) in function of the difference of potential of the two (complementary) output nodes of the comparator circuit. This mechanism eventually produces a configuration of a current mirror circuit that mirrors the lowest current on the branch through which the highest current is being forced, while ensuring a stable switching of the comparator circuit.

BRIEF DESCRIPTION OF THE DRAWINGS

The disclosed inventions will be described with reference to the accompanying drawings, which show important sample embodiments of the invention and which are incorporated in the specification hereof by reference, wherein.

DETAILED DESCRIPTION OF THE PREFERRED EMBODIMENTS

Figure 1:
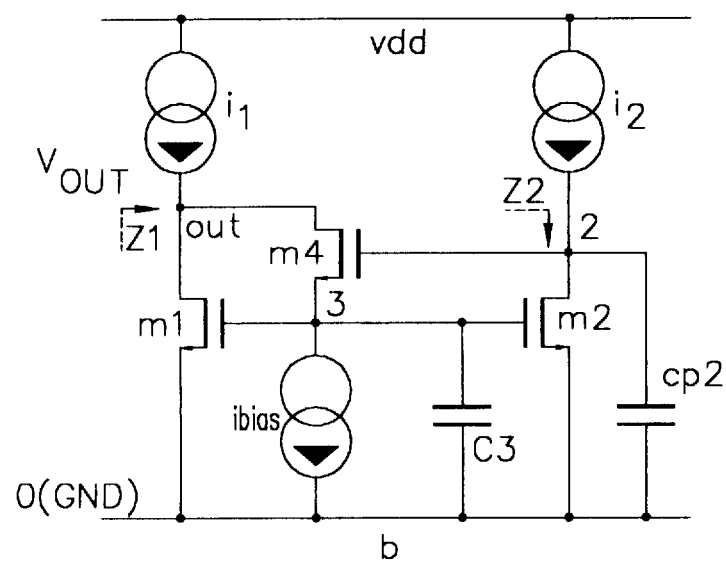
FIG. 1 is a basic scheme of a current comparator circuit realized according to the present invention.

The numerous innovative teachings of the present application will be described with particular reference to the presently preferred embodiment (by way of example, and not of limitation), in which:

FIG. 1 shows a basic circuit of a current comparator circuit realized according to the present invention using exclusively n-channel devices.

The primary function of the circuit is that of discriminating which of the two currents $I_1$ and $I_2$ is the highest. The two currents $I_1$ and $I_2$ are, respectively, forced through the two branches of the circuit where one branch comprises the transistor M1 and the other branch comprises the transistor M2. The two complementary output nodes, designated "out" and "2", respectively, alternatively assume a "high" voltage level and a "low" voltage level in function of the result of a comparison between the two currents $I_1$ and $I_2$.

A fundamental aspect of the circuit of this invention is the use of a stage that is substantially of the "source-follower" type, which in the example shown in FIG. 1, is constituted by the third transistor M4 and by the respective bias current generator Ibias.

In practice, depending on the result of the comparison between the two currents $I_1$ and $I_2$ and of the consequent eventual circuit switching, one or the other of the two transistors M1 and M2 is configured as a diode by the state assumed by the transistor M4. In this way a current mirror is realized in practice, which actually "copies" the lowest of the two currents onto the branch through which the highest current is being forced.

In the case of the circuit shown in FIG. 1, this behavior is obtained by exploiting the output characteristics of the MOS transistor M4, in a linear zone and in a saturation zone, respectively.

DC Analysis

It is well known that the output current of an MOS device follows the following physical laws:

$$I_d = k\frac{W}{L}(V_{gs} - V_{th})^2 \quad \text{(saturation)} \tag{1}$$

$$I_d = k\frac{W}{L}(2(V_{gs} - V_{th})V_{ds} - V_{ds}^2) \quad \text{(linear)} \tag{2}$$

$$\text{where } k = \frac{\mu C_{ox}}{2}.$$

By fixing the drain current value, it is possible to verify how the respective voltages Vgs and Vds behave. In a linear zone of the operating characteristics, these voltages have a mutual influence on each other, whereas in a saturation zone of the operating characteristics, the current is controlled by the voltage Vgs and only secondarily by the voltage Vds. Equation 1 highlights that, for a certain drain current, the voltage Vgs must become very high when the voltage Vds approaches zero, while according to equation 2, the voltage Vds may assume either value for a fixed value of the Vgs voltage.

By referring to the basic scheme of FIG. 1, the circuit is capable of exploiting these correlations for attaining in practice only two stable conditions, as shown by way of example by the following relationships:

a) $I_1 > I_2$ $\quad V_{(out)} \cong 5\text{ V} \quad V(2) \cong 0\text{ V}$ b) $I_1 < I_2$ $\quad V_{(out)} \cong 0\text{ V} \quad V(2) \cong 5\text{ V}$ c) $I_1 = I_2$ unstable.

During a phase a) the transistor M2 is practically diode-configured, thus causing the mirroring of the current $I_2$ on the transistor M1 (in fact, during this phase the transistor M4 behaves as source-follower). During a phase b) it is the transistor M1 that is diode-configured by the transistor M4, and therefore it causes the mirroring of the current $I_1$ on the transistor M2.

Figure 2:
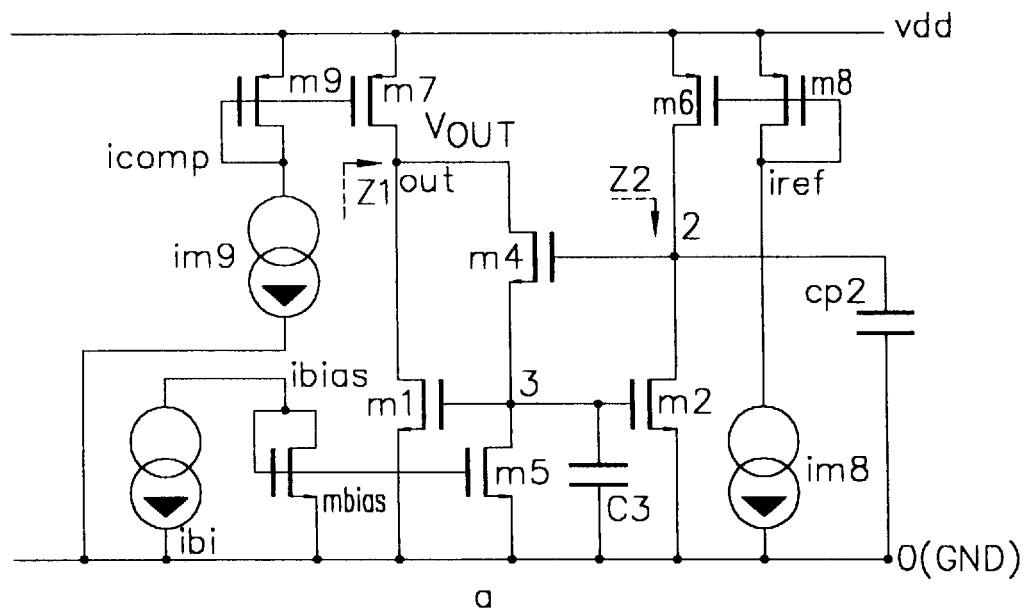
FIG. 2 shows an alternative embodiment of the comparator circuit of the present invention.

In order to enable a complete scan of the working characteristics of the basic circuit of the invention, a test circuit has been formulated whose electric scheme is depicted in FIG. 2.

Figure 3:
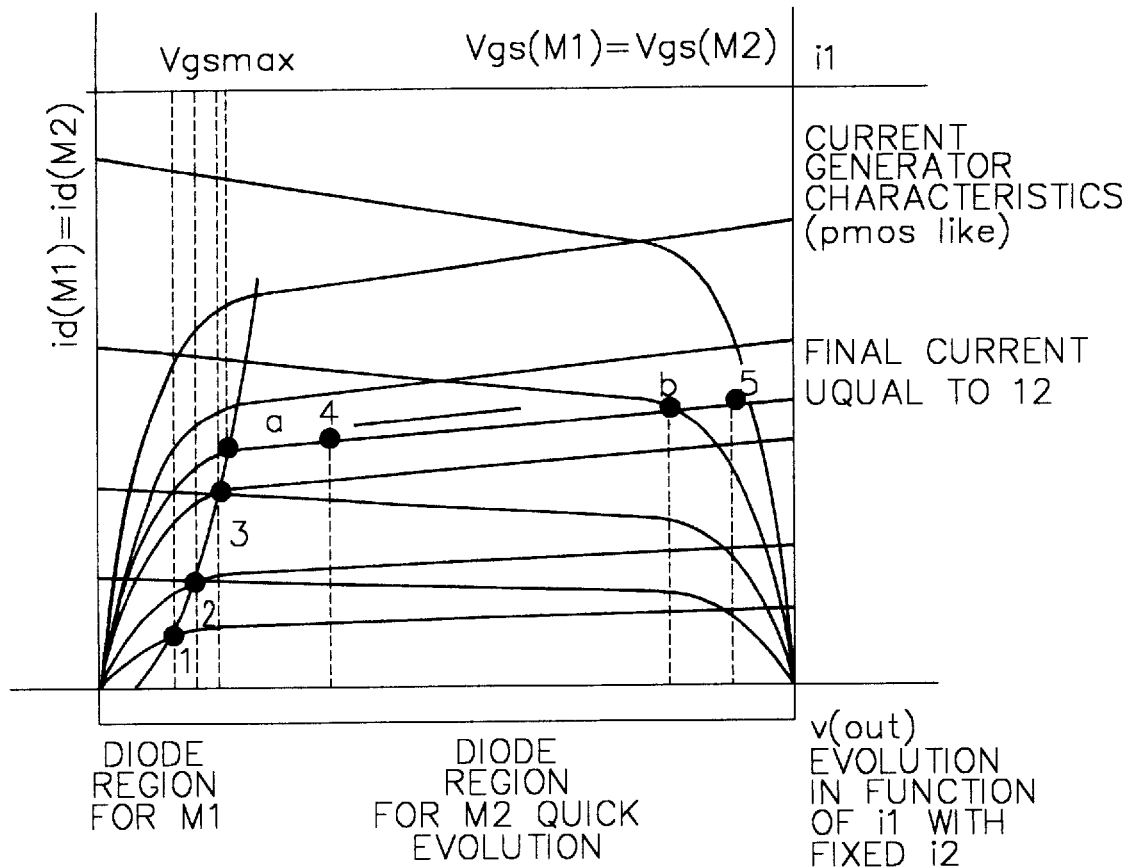
FIG. 3 shows the functioning diagrams of the basic circuit of the invention.

A complete evolution of the output DC characteristic of MOS transistors is shown in FIG. 3. By starting a test run of the circuit of FIG. 2 from a condition whereby $I_1 < I_2$, the transistor M2 is originally configured as a diode and the voltage (Vout) on the node "out" evolves through the points 1, 2 and 3 indicated on the characteristics up to a point where the increasing of the current $I_1$ brings the system to the operating point indicated by the letter a.

If the two MOS transistors M1 and M2 are of the same size, the operating point a will be reached when the current $I_1$ equals the current $I_2$ ($I_1 = I_2$). In this condition, the voltage Vgs of the transistors M1 and M2 cannot increase further.

As a consequence, the output voltage (Vout) must shift along the output characteristic of the transistor M1 in order to verify the condition $Vgs_{M1} = Vgs_{MAX}$, without any increment of the drain current, thus passing through point 4 for reaching the new point of stability indicated by the letter b.

If the current $I_1$ continues to increase, the output voltage Vout on the node "out" will also increase, evolving along the linear region of the output characteristics of the MOS transistor M7, accompanied by a further increase of the Vgs voltage.

The potential of the complementary node 2 of the circuit evolves in an exactly opposite way, only the end voltages reached by the nodes "out" and 2 are slightly different. More exactly, the final voltage on node 2 will be given by the Vgs voltage of the transistor M2 plus the $Vgs_{M2}$ voltage.

AC Analysis

It is possible to evaluate the transfer function, that is the relationship between the input current $I_1$ and the output voltage on the node 2, of the circuit of FIG. 2, through an analysis for small signals, bearing in mind that this simplification does not exactly reflect the real operating conditions of the circuit. The analysis is nevertheless capable of identifying the necessary elements for trimming the circuit toward the required speed and resolution characteristics.

Figure 4:
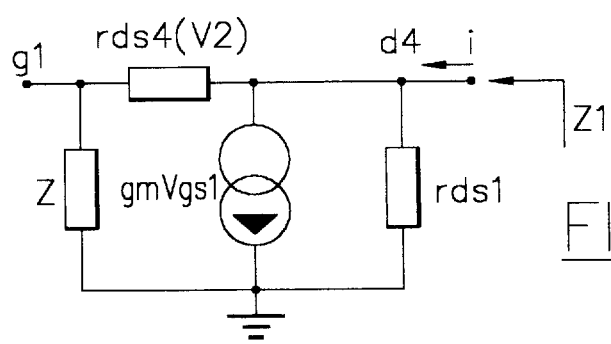
FIG. 4 shows an equivalent electric scheme for small signals of the pair of transistors M4 and M1 of the basic circuit of this invention.

Firstly, it is important to establish the impedance $Z_1$, of the output node "out". The equivalent circuit for small signals of the transistor pair M4 and M1, is shown in FIG. 4, wherein Z represents the complex impedance between the common gate of transistors M1 and M2 and ground.

Once a given input current i through the drain d of the transistor M4 is fixed, by calculating the derivative of the relation between said current i and the drain voltage $V_{d4}$, the impedance $Z_1$, of the output node "out" may be calculated, according to the following equations (where the resistance $r_{dS4}$ represents the drain-source resistance of the transistor M4 and therefore the feedback resistance of the transistor M1 which is a function of the voltage $V_2$ of node 2):

$$i = V_{gs1}g_{m1} + \frac{V_{d4}}{r_{ds1}} \tag{4}$$

but $$V_{gs1} = \frac{V_{d4}Z}{r_{ds4} + Z} \tag{5}$$

so $$i = \frac{V_{d4}Z}{r_{ds4} + Z} g_{m1} + \frac{V_{d4}}{r_{ds1}}$$

$$= V_{d4}\left(\frac{Zg_{m1}}{r_{ds4} + Z} + \frac{1}{r_{ds1}}\right)$$

$$= V_{d4}\left(\frac{Z(1 + r_{ds1}g_{m1}) + r_{ds4}}{r_{ds1}(r_{ds4} + Z)}\right)$$

and therefore $$Z1 = \frac{V_{d4}}{i} \tag{7}$$

$$= \left(\frac{r_{ds1}(r_{ds4} + Z)}{Z(1 + r_{ds1}g_{m1}) + r_{ds4}}\right)$$

A simpler model for the impedance Z may be obtained by closely observing the diagram of FIG. 2. The capacitance $C_3$ can be considered representative of the impedance Z, so we can write $$Z = \frac{1}{sC_3} \tag{8}$$

By substituting this expression into equation (7), we obtain the following explicit solution for $Z_1$:

$$Z_1 = \left(\frac{r_{ds1}\left(r_{ds4} + \frac{1}{sC3}\right)}{\frac{1}{sC3}(1 + r_{ds1}g_{m1}) + r_{ds4}}\right) \tag{9}$$

Obviously, a more significant mathematical relation is the link between the input current $I_1$ and the voltage $V_2$ of the circuit node 2. Indeed, this relation links the value of the resistance $r_{dS4}$ with $I_1$ through the voltage $V_2$. By referring to the circuit schemes of FIGS. 2 and 4, the following relations may be derived.

$$V_2 = V_{g1}g_{m2}Z_2 \tag{10}$$

but $$V_{g1} = V_1 \frac{Z}{r_{ds4} + Z} \tag{11}$$

$$= I_1 Z_1 \left(\frac{Z}{r_{ds4} + Z}\right)$$

$$= I_1 Z_1 \left(\frac{\left(\frac{1}{sC3}\right)}{\left(r_{ds4} + \frac{1}{sC3}\right)}\right)$$

so $$V_2 = I_1 \left(\frac{r_{ds1}\left(r_{ds4} + \frac{1}{sC3}\right)}{\frac{1}{sC3}(1 + r_{ds1}g_{m1}) + r_{ds4}}\right)\left(\frac{\frac{1}{sC3}}{r_{ds4} + \frac{1}{sC3}}\right)g_{m2}Z_2 \tag{12}$$

$$= I_1 \left(\frac{r_{ds1}}{(1 + r_{ds1}g_{m1}) + sC3r_{ds4}}\right)g_{m2}Z_2$$

$$= I_1 \left(\frac{r_{ds1}}{1 + \frac{sC3r_{ds4}}{1 + r_{ds1}g_{m1}}}\right)\left(\frac{g_{m2}Z_2}{1 + r_{ds1}g_{m1}}\right)$$

Observing the diagram of FIG. 2, a more significant expression for $Z_2$ can be written as in the following equation:

$$Z_2 = \frac{\left(\frac{r_{ds2}r_{ds6}}{r_{sd2} + r_{ds6}}\right)}{\left(1 + sC_{p2}\frac{r_{ds2}r_{ds6}}{r_{sd2} + r_{ds6}}\right)} \tag{13}$$

By combining the two preceding equations, we obtain the following expression for $V_2/I_1$:

$$\frac{V_2}{I_1} = \left(\frac{r_{ds1}}{1 + \left(\frac{sC3r_{ds4}}{1 + r_{ds1}g_{m1}}\right)}\right)\left(\frac{g_{m2}}{1 + r_{ds1}g_{m1}}\right)\left(\frac{\left(\frac{r_{ds2}r_{ds6}}{r_{sd2} + r_{ds6}}\right)}{1 + sC_{p2}\left(\frac{r_{ds2}r_{ds6}}{r_{sd2} + r_{ds6}}\right)}\right) \tag{14}$$

where $C_p$ represents the parasitic capacitance of the node 2 of the circuits depicted in FIGS. 1 and 2.

Equation 8 shows the existence of two poles: the dominant pole has a time constant given by:

$$\tau_1 = C_{p2}\left(\frac{r_{ds2}r_{ds6}}{r_{sd2} + r_{ds6}}\right) \tag{15}$$

A second pole is determined by the parasitic capacitance $C_3$, with a time constant given by:

$$\tau_2 = \frac{C3r_{ds4}}{1 + r_{ds1}g_{m1}} \tag{16}$$

It is important to consider that both these time constants are strongly dependent on the bias conditions of the circuit, because the drain-source impedance of MOS transistors varies drastically during the circuit switching transients.

For instance, when $I_1 < I_2$, the transistor M4 exhibits a very low $r_{ds4}$ by virtue of its high Vgs. Conversely, the resistance $r_{ds6}$ is low because the transistor M6 is functioning in a linear region.

During a transition $I_1 = I_2$, the drain-source resistance of all the MOS transistors involved is high and the speed of the circuit is controlled by the time constant $\tau_2$ because it becomes more and more independent of the Vgs of the transistor M4. The time constant $\tau_2$ assumes a constant value when the voltage $V_1$ reaches the saturation value $V_{dsat}$, as shown in FIG. 3 by the intersection point a.

Another significant verification is the evolution of the output node "out".

The equation that ties $I_1$ with $V_1$ is equation 5, which can be rewritten as follows:

$$V_1 = I_1 \left( \frac{r_{ds1}\left(r_{ds4} + \frac{1}{sC3}\right)}{\frac{1}{sC3}(1 + r_{ds1}g_{m1}) + r_{ds4}} \right) \quad (17)$$

$$= I_1 \frac{r_{ds1}}{(1 + r_{ds1}g_{m1})} \left( \frac{(1 + sC3r_{ds4})}{\left(1 + \frac{sC3r_{ds4}}{1 + r_{ds1}g_{m1}}\right)} \right)$$

$$= I_1 \frac{1}{g_{m1}} \left( \frac{(1 + sC3r_{ds4})}{\left(1 + \frac{sC3r_{ds4}}{1 + r_{ds1}g_{m1}}\right)} \right)$$

This expression contains a pole and a zero. The zero's frequency is rather low, whereas the frequency of the pole is by two to three decades higher. The drain-source resistance of the transistor M4 maintains an important role. It controls the transfer function and is dependent on the voltage $Vgs_{M4}$. In other words, it is strongly nonlinear.

Simulations

The following simulations refer to the test circuit scheme of FIG. 2. The following table shows the parameters used for this evaluation:

Netlist: (summary)
ibi 0 ib. 5 u
im8 ir0 1u
im9 ic 0 pulse(0u 40u 1u 10u 0.4u 2u 60u)
vdd 30 0 5
xcic1 30 ir ic out ib cic params: cp1=0.01p
.param c3=0.4p
.step im8 1u2.6u .5u
.subckt cic vdd iref icomp out ibias params: cp1 = 2p

| *dev. | drain | gate | source | bulk | model and size |
|---|---|---|---|---|---|
| m1 | out | 3 | 0 | 0 | nmodlow w=16u I=5u |
| m2 | 2 | 3 | 0 | 0 | nmodlow w=40u I=3u |
| m4 | out | 2 | 3 | 0 | nmodlow w=3u I=3u |
| m5 | 3 | ibias | 0 | 0 | nmodlow w=6u I=3u |
| m6 | 2 | iref | vdd | vdd | pmod w=10u I=38 |
| m8 | iref | iref | vdd | vdd | pmod w=10u I=3u |
| m7 | out | icomp | vdd | vdd | pmod w=6u I=4u |
| m9 | icomp | icomp | vdd | vdd | pmod w=6u I=4u |
| mbias | ibias | ibias | 0 | 0 | nmodlow w=6u I=3u | passive devices
c3      3    0    {c3}
cp2     2    0    {cp1}
.ends

Effects of the Bias Current "ibi" on the Circuit Precision and Speed.

Scope of a first simulation is that of testing equation 9 and particularly the effect of the parameter $r_{ds4}$ on the speed and precision characteristics.

Figure 5:
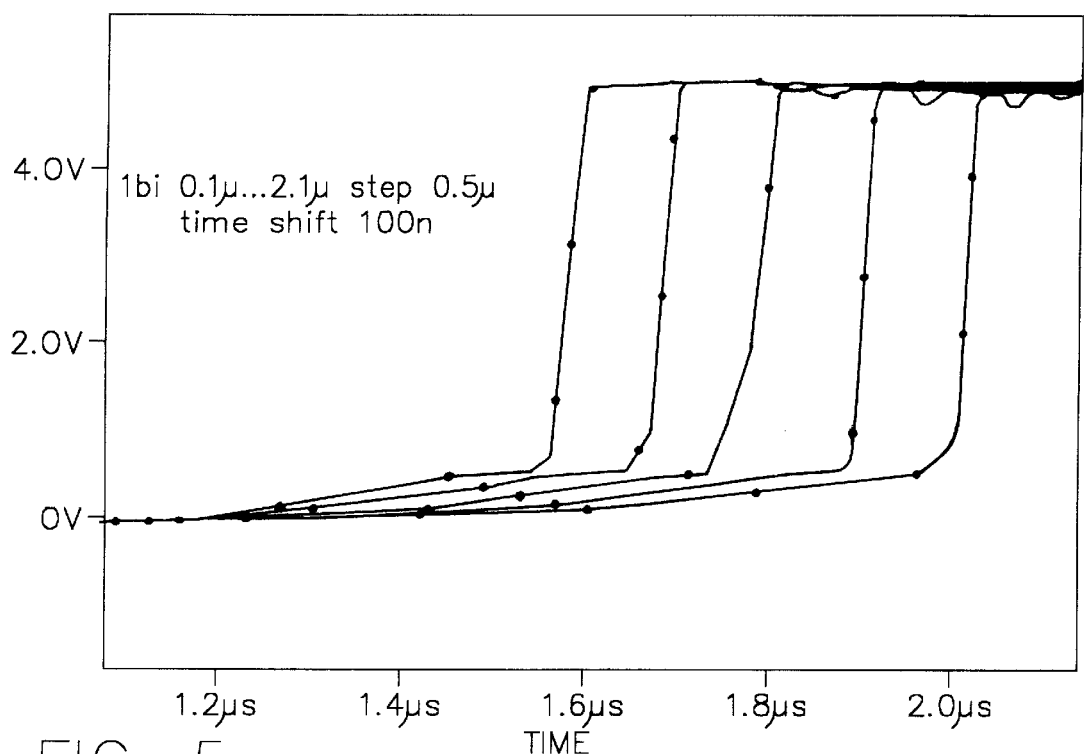
FIG. 5 shows diagrams of the response characteristic for different current levels obtained by simulation.

FIG. 5 shows the transient diagrams for different values of the bias current "ibi". The rise-time remains within the interval of 30 to 40 nanoseconds (n). Of course, the maximum speed of 30 ns is obtained with the highest value of "ibi".

The circuit has an intrinsic slew-rate determined by the capacitance of the output node "out" which does not appear in equation 9 and depends from the input ramp.

The separation between the different curves is about 100 ns, in agreement with the theoretical value of 125 µs. This value is obtained by employing a ramp generator having a gradient of 4A/s and the current value of "ibi".

Figure 6:
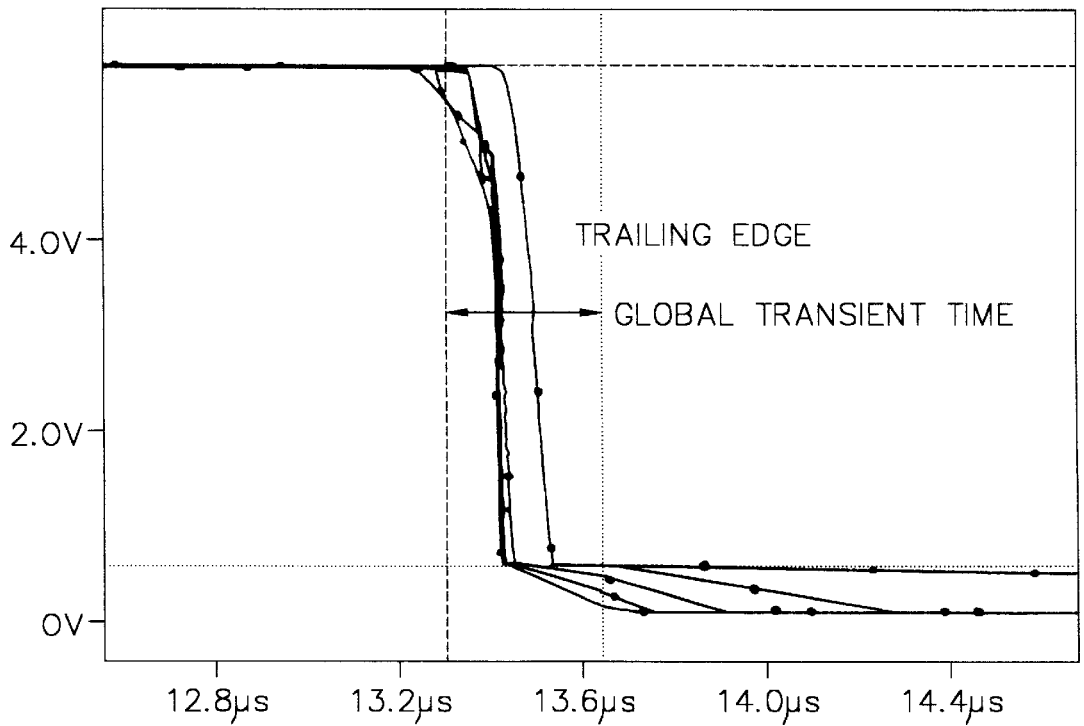
FIG. 6 shows the trailing fronts for different current levels obtained by simulation.

FIG. 6 depicts the diagrams of the trailing front transient analysis. The delays in this case are more pronounced because the current is lower than during the leading front transient. It is, however, important to note that no problem of switching-back is manifested. Such a problem is practically nonexistent because even if the current $I_1$ became zero, the output voltage can assume only the same null value.

Maximum Speed

Of course, there exists a limit for the response speed of the circuit, at which the circuit becomes incapable of discriminating the currents. With the aim of determining such a limit, a simulation was carried out according to the following parameters and conditions:

ib1 0 1 b 0.5 u
im8 ir 0 1 u
im9 ic 0 pulse(0 u 40 u 1 u 5 n 1 u 2 u 60 u)
vdd 30 0 5
xcic 1 30 ir ic out ib cic params: cp1=0.01 p
.param c3=0.4 p
.step param c3 0.1 p 2.2 p 0.5 p
.subckt cic vdd iref icomp out ibias params: cp1=2 p

| *dev. | drain | gate | source | bulk | model and size |
|---|---|---|---|---|---|
| m1 | out | 3 | 0 | 0 | nmodlow w=16u I=5u |
| m2 | 2 | 3 | 0 | 0 | nmodlow w=40u I=3u |
| m4 | out | 2 | 3 | 0 | nmodlow w=3u I=3u |
| m5 | 3 | ibias | 0 | 0 | nmodlow w=6u I-3u |
| m6 | 2 | iref | cell | cell | pmod w=10u I=3u |
| m8 | iref | iref | cell | cell | pmod w=10u I=3u |
| m7 | out | icomp | vdd | vdd | pmod w=6u I=4u |
| m9 | icomp | icomp | vdd | vdd | pmod w=6u I=4u |
| mbias | ibias | ibias | 0 | 0 | nmodlow w=6u I=3u | passive device and supply
c3       3     0     {c3}
cp2      2     0     {cp1}
vcell    cell  0     2v
.ends The impulse rise-time was reduced to 5 ns with drain voltages of the transistor M6 and M8 reduced to 2 V in order to simulate the worst case.

Figure 7:
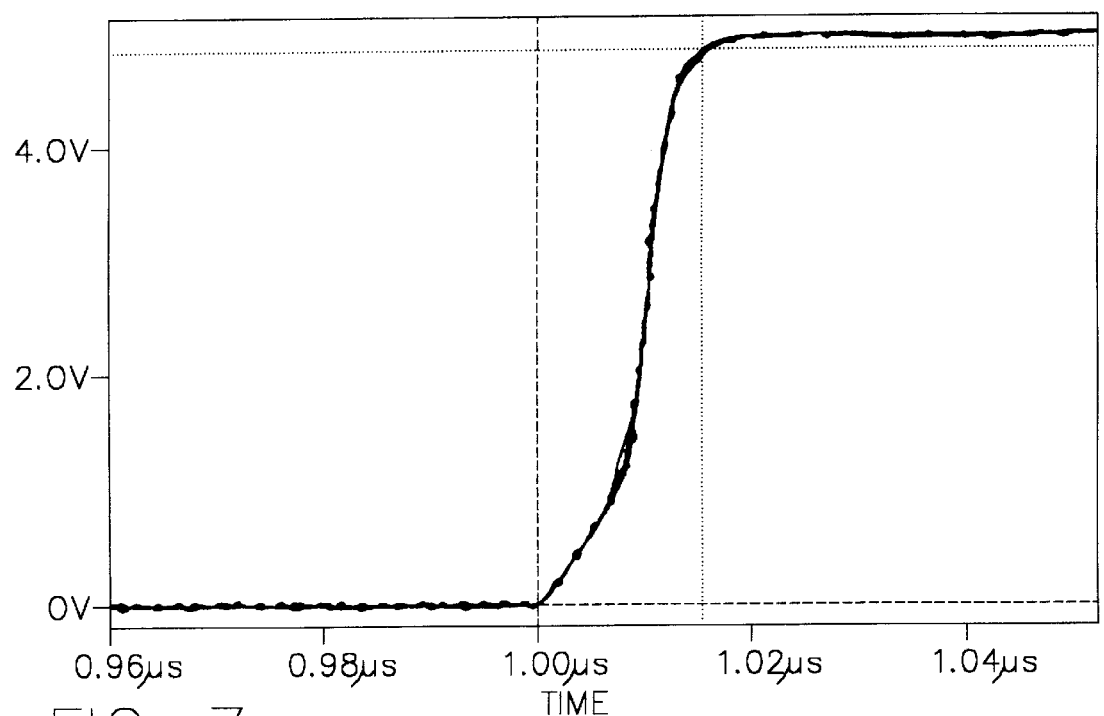
FIG. 7 shows the switchings rise-time.

The result of this simulation is shown in the diagram of FIG. 7 wherefrom it can be observed that the maximum transient speed for a current variation $\Delta 1_{M9} = 40 \mu A$ is 16 ns.

Effects of the Parasitic Capacitance $C_3$

As demonstrated by the AC analysis, the parasitic capacitance $C_2$ has an important role in determining the response characteristics of the circuit. This capacitance does not have a major effect during switching, because the value of the drain source $r_{ds4}$ resistance is so high that the output node "out" is completely isolated from the capacitance $C_3$. The evolution of the voltage Vout of the "out" node is controlled by the slew-rate characteristics and not by the time constant. For this reason, the effect on the capacitance $C_3$ should manifest itself during the first part of the transient, before the turning point of the switching.

Figure 8:
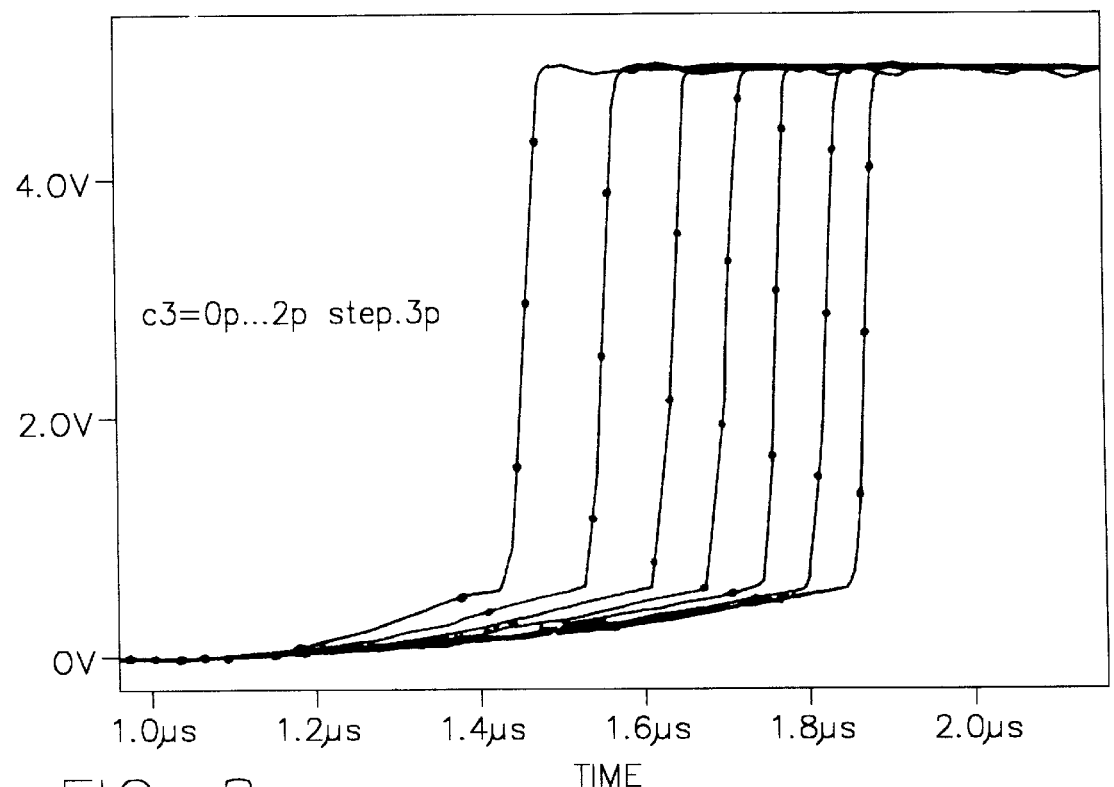
FIG. 8 shows the effect of the capacitance C3.

This is confirmed by the simulation results shown in FIG. 8. The effect of the capacitance $C_3$ can be considered as a delay factor in switching, because the voltage on the node 3 cannot any longer follow the ramp speed for ever increasing values of the capacitance $C_3$. A further simple and intuitive interpretation can be made by considering the overall current balance on the output node "out".

The simulations demonstrate that the characteristics of the leading transient tend to get closer to each other for relatively high values of $C_3$; the limit being given by missing the transition for $C_3$ tending to infinity.

Capacitance CP2

The capacitive load on the node 2 slows-down the functioning of the circuit.

A lower "ibi" current has the effect of impelling the transistors M4, M1 and M2 toward an OFF-state. Indeed, the coupling capacitance between the drain and the gate of M1 injects current into the node 3 and switches off the transistor M4, thus precluding the mirroring of the current of M2 on M1. The following equations define the OFF-state condition for the transistor M4:

$$C_{ds2}\frac{dV_2}{dt} + C_{ds1}\frac{dV_{out}}{dt} > ibi \quad M4 = \text{off} \quad (18)$$

$$C_{ds2}\frac{dV_2}{dt} + C_{ds1}\frac{dV_{out}}{dt} < ibi \quad M4 = \text{on}$$

Due to the fact that the switching of the complementary nodes "out" and 2, in the absence of a capacitance CP2, have similar time constants, the two drain-gate capacitances of the transistors M2 and M1 share the charge injected into node 3, thus preventing the switching off of the transistor M4.

In conclusion, the load capacitance of the node 2 (CP2) slows down the evolution of the voltage on the node 2, according to equation 8, and, in the limit, the above mentioned compensation becomes insufficient, leading to the consequent switching off of the transistor M4. In this case, the circuit requires a period of time relatively long for regaining its functionality.

Of course, the higher the bias current ibi, the lower the likelihood that such an effect has to take place, ensuring a conduction state of all the circuit transistors. An alternative way of compensating such a current injection could be that of adding a capacitance of an appropriate value between the nodes 2 and 3 of the circuit.

Figure 9:
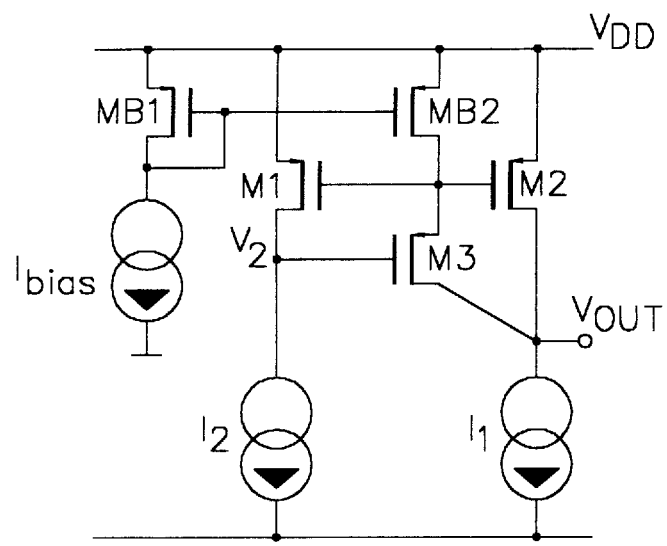
FIG. 9 depicts a circuit of the invention realized with p-channel devices.

Of course, the circuit of the invention can be realized in different ways. FIG. 9 shows an embodiment of the circuit with p-channel MOS transistors, rather than with n-channel transistors, as in the example analyzed.

Figure 10:
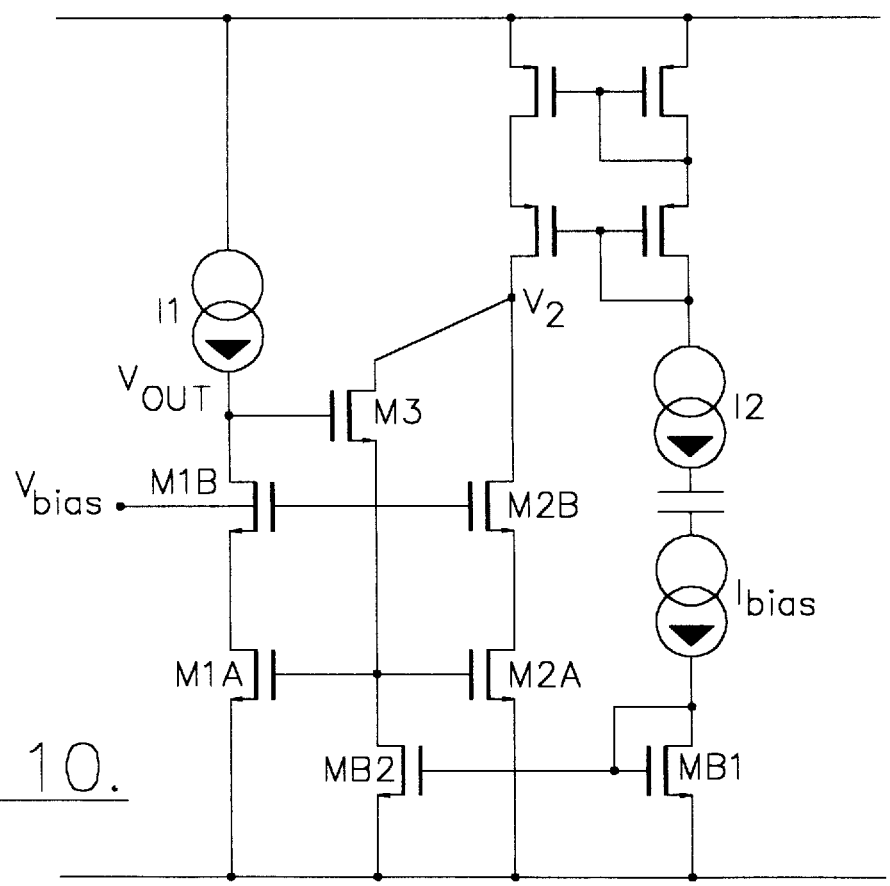
FIG. 10 is a circuit of the invention realized with cascoded p-channel devices.

FIG. 10 shows an alternative embodiment of the circuit of the invention with cascoded n-channel transistors. Of course, a similar complementary scheme would employ cascoded p-channel transistors.

Figure 11:
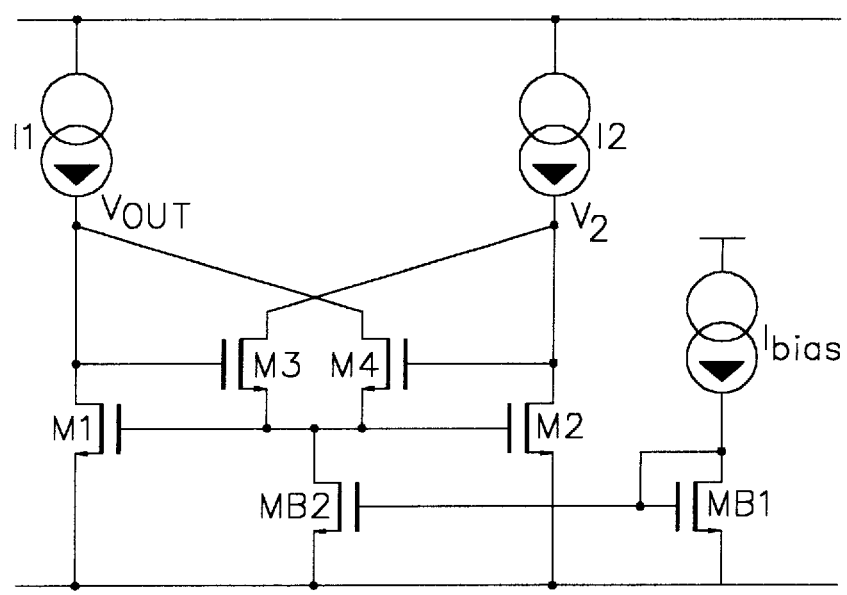
FIG. 11 shows an embodiment of the circuit of the invention according to a complementary architecture.

Finally, FIG. 11 shows a configuration of the circuit of the invention according to a complementary architecture.

According to a disclosed class of innovative embodiments, there is provided an integrated current comparator circuit, comprising: first and second field-effect transistors, each operatively connected to be driven, at a drain terminal thereof, with a respective current to be compared; said first and second transistors having respective gates and sources thereof connected together; a bias current generator, connected to provide a bias current to said gates of said first and second transistors; and an additional transistor which has a gate thereof connected to said drain of said first transistor, a drain thereof connected to said drain of said second transistor, and a source thereof connected to said gates of said first and second transistors; whereby said additional transistor provides a two-way current-mirroring relationship, between said first and second transistors, which mirrors the instantaneously lower one of said respective currents from one of said first and second transistors onto the other of said first and second transistors; wherein said drains of said first and second transistors are operatively connected to provide a voltage output signal which indicates which of said respective currents is greater.

According to another disclosed class of innovative embodiments, there is provided an integrated current comparator circuit, comprising first and second transistors, each operatively connected to receive, across first and second respective current-carrying terminals, a respective current to be compared; said first and second transistors having respective control terminals, which are connected together; a bias current generator, connected to provide a bias current to said control terminals of said first and second transistors; and an additional transistor which has a control terminal thereof connected to said second current-carrying terminal of said first transistor, a first current-carrying terminal thereof connected to said second current-carrying terminal of said second transistor, and a second current-carrying terminal thereof connected to said control terminals of said first and second transistors; whereby said additional transistor provides a two-way current-mirroring relationship, between said first and second transistors, which mirrors the instantaneously lower one of said respective currents from one of said first and second transistors onto the other of said first and second transistors; wherein said second current-carrying terminals of said first and second transistors are operatively connected to provide a voltage output signal which indicates which of said respective currents is greater.

According to another disclosed class of innovative embodiments, there is provided a method for comparing currents, comprising the steps of receiving first and second input currents at first and second input nodes; passing said first and second currents through first and second circuit branches respectively, comparing said first and second currents to determine which of said two currents is lesser; mirroring said lesser current to the other of said first and second circuit branches; generating a voltage output which indicates which of said first and second currents is the lesser current.

According to another disclosed class of innovative embodiments, there is provided current comparator circuit capable of producing a logic configuration of two complementary nodes, respectively of a first and of a second branch of the circuit, in function of the comparison between a first current forced through said first branch and a second current forced through said second branch of the circuit, characterized in that it comprises means responsive to the logic configuration of said complementary nodes and assuming a state capable of limiting the current in the branch through which is forced the highest current to the value of the current forced through the other branch of the circuit.

According to another disclosed class of innovative embodiments, there is provided a current comparator circuit capable of producing a logic configuration of two complementary nodes, respectively of a first and of a second branch of the circuit, in function of the comparison between a first current forced through said first branch and a second current forced through said second branch of the circuit, characterized in that it comprises means responsive to the logic configuration of said complementary nodes and assuming a state capable of limiting the current in the branch through which is forced the highest current to the value of the current forced through the other branch of the circuit.

According to another disclosed class of innovative embodiments, there is provided: The current comparator circuit as defined in claim 14, characterized in that said means consist of at least a transistor having a control terminal coupled to one of said nodes and current terminals coupled to the other of said nodes and to a common control node, respectively, of a pair of transistors of said first and of said second branch, respectively, of the circuit and a bias current generator connected between a common supply node of the circuit and said common control node.

According to another disclosed class of innovative embodiments, there is provided a method for limiting the absorption of current of a current comparator circuit capable of producing a logic configuration of two complementary nodes of a first branch and of a second branch, respectively, of the circuit in function of the comparison between a first current forced through said first branch and a second current forced through said second branch, characterized in that it comprises discriminating the lowest between said two currents; mirroring said discriminated lowest current on the circuit branch into which the highest current is being forced.

The following background publications discuss many modifications and variations which could be made to the innovative embodiments, which would be apparent to one skilled in the art. Some basic and general background may also be found in the following books, all of which are hereby incorporated by reference: the ANALOG CIRCUIT DESIGN SEMINAR books published by Analog Devices; ANALOG CIRCUIT DESIGN (ed. J. Williams 1991); Analog Dialogue from 1980 to date; Collins, ANALOG ELECTRONICS HANDBOOK (1989); Coughlin and Driscoll, OP AMPS AND LINEAR INTEGRATED CIRCUITS 3.ed. (1991); Davidse, INTEGRATION OF ANALOGUE ELECTRONIC CIRCUITS; Feucht, HANDBOOK OF ANALOG CIRCUIT DESIGN (1990); Geiger et al., VLSI DESIGN TECHNIQUES FOR ANALOG AND DIGITAL CIRCUITS; Gray & Meyer, ANALYSIS & DESIGN OF ANALOG INTEGRATED CIRCUITS (2.ed. 1983 and 3.ed. 1993); Grebene, BIPOLAR & MOS ANALOG IC DESIGN (1984); Haskard and May, ANALOG VLSI DESIGN (1987); L. P. Huelsman, and P. E. Allen, INTRODUCTION TO THE THEORY AND DESIGN OF ACTIVE FILTERS (1980); Moschytz, LINEAR INTEGRATED NETWORKS: DESIGN (1975); Moschytz, LINEAR INTEGRATED NETWORKS: FUNDAMENTALS (1974); Pease, TROUBLESHOOTING ANALOG CIRCUITS; Schaumann et al., DESIGN OF ANALOG FILTERS (1990); J. Scott, ANALOG ELECTRONIC DESIGN (1991); Soclof, "Design and Applications of Analog Integrated Circuits"; Toumazou et al., ANALOGUE IC DESIGN: THE CURRENT-MODE APPROACH; Van Valkenburg, ANALOG FILTER DESIGN (1982); Thomas Young, LINEAR INTEGRATED CIRCUITS (1981).

Modifications and Variations

As will be recognized by those skilled in the art, the innovative concepts described in the present application can be modified and varied over a tremendous range of applications, and accordingly the scope of patented subject matter is not limited by any of the specific exemplary teachings given.

For example, as will be obvious to those of ordinary skill in the art, other circuit elements can be added to, or substituted into, the specific circuit topologies shown.

For another example, within the constraints well-known to those of ordinary skill, a variety of well-known current mirror configurations can be substituted for those shown.

For another example, within the constraints well-known to those of ordinary skill, a variety of well-known amplifier configurations can be substituted for those shown.

What is claimed is:

1. An integrated current comparator circuit, comprising:
   first and second field-effect transistors, each operatively connected to be driven, at a drain terminal thereof, with a respective current to be compared; said first and second transistors having respective gates and sources thereof connected together;
   a bias current generator, connected to provide a bias current to said gates of said first and second transistors; and
   an additional transistor which has
     a gate thereof connected to said drain of said first transistor,
     a drain thereof connected to said drain of said second transistor, and
     a source thereof connected to said gates of said first and second transistors;
   whereby said additional transistor provides a two-way current-mirroring relationship, between said first and second transistors, which mirrors the instantaneously lower one of said respective currents from one of said first and second transistors onto the other of said first and second transistors;
   whereby said additional transistor operates in a linear mode or in saturation according to said respective currents;
   wherein said drains of said first and second transistors are operatively connected to provide a voltage output signal which indicates which of said respective currents is greater.

2. The integrated circuit of claim 1, wherein said first and second transistors have equal sizes.

3. The current comparator circuit according to claim 1, wherein said transistors are p-channel MOS transistors.

4. The current comparator circuit according to claim 1, wherein said transistors are n-channel MOS transistors.

5. The current comparator circuit according to claim 1, wherein said transistors are cascoded p-channel MOS transistors.

6. The current comparator circuit according to claim 1, wherein said transistors are cascoded n-channel MOS transistors.

7. An integrated current comparator circuit, comprising:
   first and second transistors, each operatively connected to receive, across first and second respectively current-carrying terminals, a respective current to be compared; said first and second transistors having respective control terminals, which are connected together;
   a bias current generator, connected to provide a bias current to said control terminals of said first and second transistors; and
   an additional transistor which has
     a control terminal thereof connected to said current-carrying terminal of said first transistor, a first current-carrying terminal thereof connected to said second current-carrying terminal of said second transistor, and a second current-carrying terminal thereof connected to said control terminals of said first and second transistors;

whereby said additional transistor provides a two-way current-mirroring relationship, between said first and second transistors, which mirrors the instantaneously lower one of said respective currents from one of said first and second transistors onto the other of said first and second transistors;

whereby said additional transistor operates in a linear mode or in saturation according to said respective currents;

wherein said second current-carrying terminals of said first and second transistors are operatively connected to provide a voltage output signal which indicates which of said respective currents is greater.

8. The integrated circuit of claim 7, wherein said first and second transistors have equal sizes.

9. The current comparator circuit according to claim 7, wherein said transistors are p-channel MOS transistors.

10. The current comparator circuit according to claim 7, wherein said transistors are n-channel MOS transistors.

11. The current comparator circuit according to claim 7, wherein said transistors are cascoded p-channel MOS transistors.

12. The current comparator circuit according to claim 7, wherein said transistors are cascoded n-channel MOS transistors.

13. A method for comparing currents, comprising the steps of:

receiving first and second input currents at first and second input nodes;

passing said first and second currents through first and second circuit branches respectively, comparing said first and second currents to determine which of said two currents is lesser;

mirroring said lesser current to the other of said first and second circuit branches;

generating a voltage output which indicates which of said first and second currents is the lesser current.

14. Current comparator circuit for producing a logic configuration of two complementary nodes, respectively of a first and of a second branch of the circuit, in function of the comparison between a first current forced through said first branch and a second current forced through said second branch of the circuit, characterized in that it comprises means responsive to the logic configuration of said complementary nodes and assuming a state for limiting the current in the branch through which is forced the highest current of the first and second current to the value of the current forced through the other branch of the circuit.

15. The current comparator circuit as defined in claim 14, characterized in that said means comprise at least a transistor having a control terminal coupled to one of said nodes and current terminals coupled to the other of said nodes and to a common control node, respectively, of a pair of transistors of said first and of said second branch, respectively, of the circuit and a bias current generator connected between a common supply node of the circuit and said common control node.

16. The current comparator circuit according to claim 15, characterized in that said means comprise a pair of transistors cross-coupled to the two circuit branches.

17. The current comparator circuit according to claim 14, characterized in that it is realized with p-channel MOS transistors.

18. The current comparator circuit according to claim 15, characterized in that it is realized with p-channel MOS transistors.

19. The current comparator circuit according to claim 14, characterized in that it is realized with n-channel MOS transistors.

20. The current comparator circuit according to claim 15, characterized in that it is realized with n-channel MOS transistors.

21. The current comparator circuit according to claim 14, characterized in that it is realized with cascoded p-channel MOS transistors.

22. The current comparator circuit according to claim 15, characterized in that it is realized with cascoded p-channel MOS transistors.

23. The current comparator circuit according to claim 14, characterized in that it is realized with cascoded n-channel MOS transistors.

24. The current comparator circuit according to claim 15, characterized in that it is realized with cascoded n-channel MOS transistors.

25. A method for limiting the passing of current of a current comparator circuit for producing a logic configuration of two complimentary nodes of a first branch and of a second branch, respectively, of the circuit in function of the comparison between a first current forced through said first branch and a second current forced through said second branch, characterized in that it comprises discriminating the lowest between said two currents;

mirroring said discriminated lowest current on the circuit branch into which the highest current is being forced.

* * * * *

UNITED STATES PATENT AND TRADEMARK OFFICE
CERTIFICATE OF CORRECTION

PATENT NO. : 5,770,954
DATED : June 23, 1998
INVENTOR(S) : Tomasini et al.

It is certified that error appears in the above-identified patent and that said Letters Patent is hereby corrected as shown below:

On the title page, item
[30] Foreign Application Priority Data

Strike:
" October 19, 1995 "

Insert:
-- October 9, 1995 --

Signed and Sealed this

Twenty-seventh Day of October, 1998

Attest:

BRUCE LEHMAN

Attesting Officer

Commissioner of Patents and Trademarks